(12) United States Patent
Huang et al.

(10) Patent No.: US 6,441,439 B1
(45) Date of Patent: Aug. 27, 2002

(54) LOW-VOLTAGE TRIGGERING PSEUDO BIPOLAR ESD PROTECTION DEVICE FOR POSITIVE/NEGATIVE SIGNAL INPUT PADS

(75) Inventors: Chih-Yao Huang; Wei-Fan Chen, both of Hsinchu (TW)

(73) Assignee: Winbond Electronic Corp., Hsinchu (TW)

( * ) Notice: Subject to any disclaimer, the term of this patent is extended or adjusted under 35 U.S.C. 154(b) by 0 days.

(21) Appl. No.: 09/940,398

(22) Filed: Aug. 27, 2001

Related U.S. Application Data
(60) Provisional application No. 60/294,876, filed on May 30, 2001.

(51) Int. Cl.⁷ ............................................. H01L 23/62
(52) U.S. Cl. ..................... 257/355; 257/361; 257/362
(58) Field of Search ................................ 257/355, 356, 257/360, 361, 362

(56) References Cited

U.S. PATENT DOCUMENTS 5,012,317 A * 4/1991 Rountre ....................... 361/56
6,353,237 B1 * 3/2002 Yu .............................. 257/360

* cited by examiner

Primary Examiner—Phat X. Cao
(74) Attorney, Agent, or Firm—W. Wayne Liauh

(57) ABSTRACT

An electrostatic discharge (ESD) protection device for protecting semiconductor devices against high-voltage transients due to electrostatic discharges. It includes: (1) an N-type well formed in a P-type semiconductor layer (or P-substrate); (2) a plurality of first P+ regions formed in the P-type semiconductor layer, wherein each of the first P+ regions is connected to an input,pad and is formed inside the N-type well; (3) a plurality of second P+ regions formed in the P-type semiconductor layer, wherein each of the second P+ regions is connected to the ground, at least one of the second P+ regions is outside the N-type well, and at least one of the second P+ regions is either in the N-type well or adjacent to it; and (4) an N+ region formed outside of the N-type well. The plurality of first P+ regions, the plurality of second P+ regions, the N+ region, and the N-type well form a plurality of pnp devices connected in parallel to allow a transient voltage to be discharged from the input pad to ground. The N+ region, the P-substrate, and the N-well form an npn device, which is not directly connected to either the ground or the input pad and which allows the transient voltages to be discharged in a reverse direction.

10 Claims, 3 Drawing Sheets

LOW-VOLTAGE TRIGGERING PSEUDO BIPOLAR ESD PROTECTION DEVICE FOR POSITIVE/NEGATIVE SIGNAL INPUT PADS

This application claims benefit of provisional No. 60/294,876 filed May. 30, 2001.

FIELD OF THE INVENTION

The present invention relates to an improved electrostatic discharge (ESD) protection device for providing protections against high-voltage transients due to electrostatic discharge. More specifically, the present invention relates to an improved ESD protection device for use in integrated circuits to protect semiconductor devices from incurring damages because of high-voltage transients due to electrostatic discharges. The ESD protection device present invention provides excellent robustness, does not require high voltage for triggering, and yet it is uniquely designed such that it is not vulnerable to being accidentally triggered due to non-ESD noises. Another advantage of the ESD protection device of the present invention is that it also provides an excellent flexibility to adjust the base width to optimize the breakdown behavior.

BACKGROUND OF THE INVENTION

When a semiconductor device is brought in contact with an external electrostatic charge source (often designated as an input pad), an electrostatic discharge (ESD) will result. Semiconductor devices often have only a very small amount of series resistance between the input pad and the actual devices. When the input pad contains substantial amounts of electrostatic charges, the lack of series resistance associated with the semiconductor devices allows large amounts of electrostatic charges to pass through the circuitry for only a very short duration, resulting in very large voltage transients. Such an electrostatic discharge has proven in recent years to be a major cause contributing to the failures of a large number of semiconductor devices, and the integrated circuits containing the same.

U.S. Pat. No. 4,484,244 discloses ESD protection circuit systems utilizing one or more silicon control rectifiers (SCR) as transient protection structures in integrated circuits. Basically, these devices are bipolar devices each containing two SCR's, one for protection from positive transient and another for protection from negative transients. Because these devices require a large number of diffused regions, they are compatible with semiconductors formed using metal oxide silicon technologies.

U.S. Pat. No. 5,012,317 discloses another ESD protection device which includes a PNPN type device disposed between an input pad and ground. For positive transients, a first P-region is disposed in an N-type well which, in turn, is formed in a P-type layer, and a second N-type region is provided for connection to the ground. This provides an SCR which can be turned on by avalanching an intermediate PN junction to place the device in a regenerative mode for positive transients. For negative transients, a P+ region is provided in the P-layer to bypass the PN junction and a N+ region is defined in the N-type region to bypass another PN junction. This provides a forward-biased diode for the negative transients. The positive/negative bipolar ESD protection device has shown to provide excellent robustness, but it was found to be quite vulnerable to be accidentally turned on due to non-ESD-related triggering noises such as latchup.

SUMMARY OF THE INVENTION

The primary object of the present invention is to develop an improved electrostatic discharge (ESD) device for use in integrated circuits containing semiconductor devices. More specifically, the primary object of the present invention is develop an improved ESD protection device to protect semiconductor devices from incurring damages due to high-voltage transients. The ESD protection device of the present invention to be developed must exhibit excellent robustness under rugged conditions; it must also not require high triggering voltage. Furthermore, it must overcome the shortcoming of prior art devices such that it will not be accidentally triggered by a non-ESD noise such as latchup.

One of the key elements of the present invention is to implant a plurality of P+ regions in a floating N-type well (or "N-well"), which is, in turn, formed in a P-type layer. These P+ regions are electrically connected to the input pad (i.e., the source of the electrostatic discharge). The ESD protection device of the present invention also contains a plurality of P+ regions that are connected to the ground, and an N+ region that is not grounded. The N+ region is formed in the P-type layer but outside the N-well. At least one of the grounded P+ region must be outside of the N-well (but still in the P-type layer). The rest of the grounded P+ region or regions can be in the N-well.

The combinations of (1) the plurality of the P+ regions in the N-well that are connected to the input pad, (2) the ungrounded N-well region, and (3) the grounded P+ regions in the N-well of the present invention form a plurality of open-base pnp bipolar transistors in the N-well. This is utilized to ensure that a low-voltage switching structure to turn on one of the pseudo bipolar structure of the present invention. The plurality of the pseudo pnp bipolar structures utilizing a common ungrounded N+ region prevent the ESD protection device of the present invention from being accidentally triggered by a non-ESD noise such as latchup, and turn on as a protection switch during an ESD event. The floating N-well is utilized to keep in off state regardless of whether the input signal is either positive or negative during normal operation conditions.

In summary, the present invention discloses an improved ESD protection device which comprises the following main elements:

(1) an N-type well formed in a P-type semiconductor layer;

(2) a plurality of first P+ regions formed in the P-type semiconductor layer, wherein each of the first P+ regions is connected to an input pad and is formed inside the N-type well;

(3) a plurality of second P+ regions formed in the P-type semiconductor layer, wherein each of the second P+ regions is connected to the ground and at least one of the second P+ regions is outside the N-type well; and (4) an N+ region formed outside of the N-type well;

(5) whereby the plurality of first P+ regions, the plurality of second P+ regions, and the N+ region form a plurality of pnp devices in the N-type well to allow a transient voltage to be discharged from the input pad to ground.

As provided above, the multiplicity of the pseudo pnp structures provided in the ESD prevention device of the present invention allow the ESD device to be triggered without requiring a high voltage, while preventing it from being accidentally triggered by a non-ESD noise.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved electrostatic discharge (ESD) device for use in integrated circuits to protect semiconductor devices from incurring damages due to high-voltage transients. The ESD of the present invention exhibits excellent robustness under rugged conditions, does not require high triggering voltage, while it will not be accidentally triggered by a non-ESD noise such as latchup.

Figure 1:
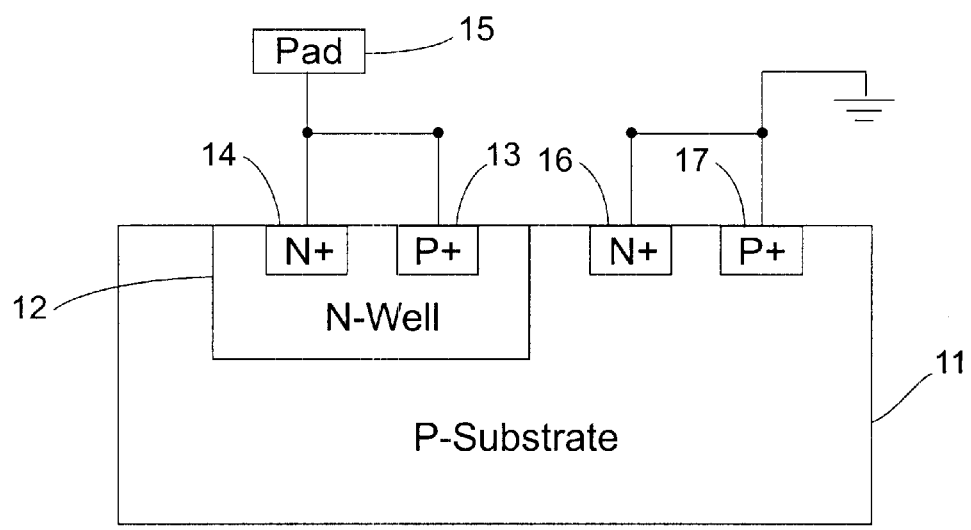
FIG. 1 is a schematic drawing showing a cross-sectional view of a prior art ESD protection device.

FIG. 1 is a schematic drawing showing a cross-sectional view of a prior art ESD protection device. A P-type semiconductor substrate 11 is provided which is lightly doped. An N-type well (or N-well) 12 is defined in the P-type substrate 11 by a diffusion process to provided a lightly doped N-type semiconductor region. This forms a first PN junction. A P+ region 13 is diffused into the N-type well 12. The PN junction between the P+ region 13 and the N-type well 12 provides a second PN junction. A first N+ region 14 of heavily doped N-type material is defined in the N-type well 12 and connects to a resistor, not shown, which is connected to an input pad 15. The first N+ region 14 is connected to the input pad 15 to provide a resistive connection between pad 15 and the N-type well 12 to allow reverse conduction through the first PN junction.

FIG. 1 also shows a heavily doped second N-type region 16 is provided in the P-type substrate 11 but outside of the N-type well 12. The junction between the second N+ region 16 and the P-type substrate 11 provides a third PN junction. A heavily doped second P-type region 17 is provided in the P-type substrate 11 outside of the N-type well 12 to provide a P+ low resistivity region. The second P+ region 17 is connected to a resistance provided by the P+ substrate 11. The second N+ region 16 and the second P+ region 17 are both connected to $V_{ss}$ or ground. In operation, the positive transient causes current to flow through the first P+ region 13 to avalanche the first PN junction between the N-type well 12 and the P-type substrate 11. The current then flows from the P-type substrate to the second N+ region 16 across the third PN junction then to the ground. In the reverse transient mode, current flows from ground through the second P+ region 17 to P-type substrate 11. In this mode, current flows the P-type substrate 11 through the second PN junction to N-type well 12 and through the first N+ region 14 to pad 15.

The ESD protection device taught in the '317 patent is essentially a silicon control rectifier with an PNPN type structure. It has provided excellent robustness and can be triggered at a substantially lower voltage than previous devices. However, it suffers from the vulnerability to be triggered by non-ESD noise such as latchup.

The ESD protection device disclosed in the present invention has many elements similar to that of the '317 patent.

However, there are several differences. More specifically, the ESD of the present invention contains a plurality of first P+ regions in the N-well that are connected to the pad, an N+ region that is not grounded, and a plurality of second P+ regions that are grounded. Furthermore, at least one of the grounded second P+ regions is either in the N-well or adjacent to the N-well. As a result, the ESD of the present invention contains a plurality of pnp devices in parallel which are connected to an npn device.

In summary, the present invention discloses an improved ESD protection device which contains the following key elements:

(1) an N-type well formed in a P-type semiconductor layer;

(2) a plurality of first P+ regions formed in the P-type semiconductor layer, wherein each of the first P+ regions is connected to an input pad and is formed inside the N-type well;

(3) a plurality of second P+ regions formed in the P-type semiconductor layer, wherein each of the second P+ regions is connected to the ground, at least one of the second P+ regions is outside the N-type well, and at least one of the second P+ regions is either in the N-type well or adjacent to it; and (4) an N+ region formed outside of the N-type well;

(5) whereby the pnp device in the floating N-well serves as the triggering element for the ESD, and the plurality of pnp devices formed from the first P+ regions, the plurality of second P+ regions, the N+ region, and the N-type well form the main ESD protection element to allow a transient voltage to be discharged from the input pad to ground.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Figure 2:
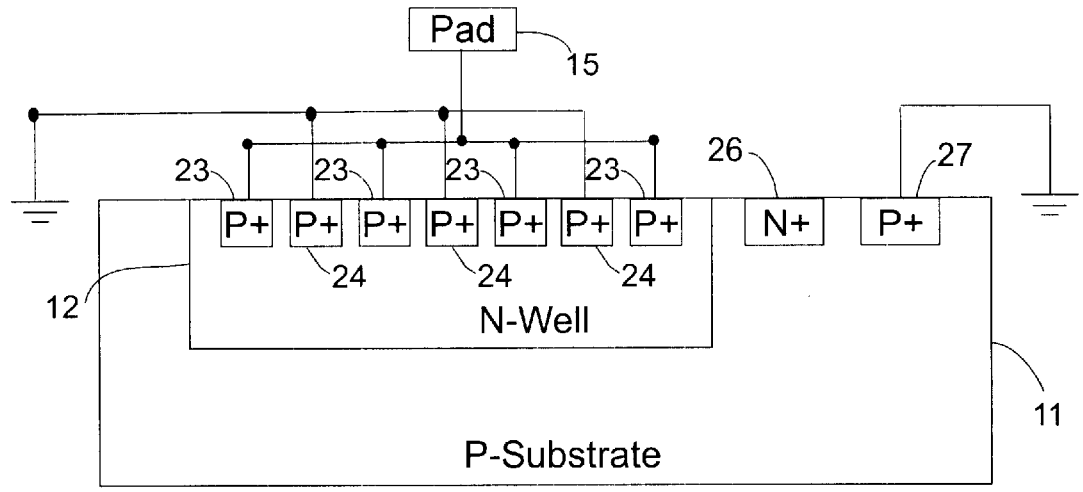
FIG. 2 is a schematic drawing showing a cross-sectional view of an improved ESD protection device according to a preferred embodiment of the present invention.
Figure 3:
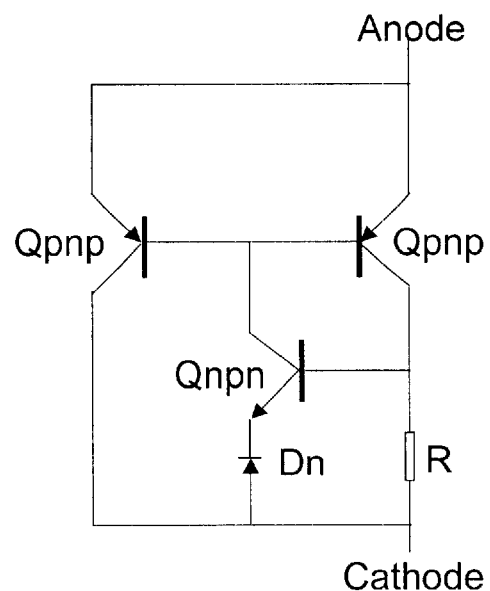
FIG. 3 is an illustrative circuit diagram corresponding to the ESD protection device as shown in FIG. 2.

FIG. 2 is a schematic drawing showing a cross-sectional view of an improved ESD protection device according to the first preferred embodiment of the present invention, and FIG. 3 is an illustrate circuit diagram corresponding to the ESD protection device as show n in FIG. 2.

In this first preferred embodiment of the present invention, the ESD prevention device, similar to that in the '317 patent, contains a P-type semiconductor substrate 11 which is lightly doped. An N-type well (or N-well) 12 is defined in the P-type substrate 11 by a diffusional process to provide a lightly doped N-type semiconductor region. However, unlike the '317 patent, which contains a single P+ region inside the N-well, the ESD prevention of the present invention contains a plurality of first P+ regions 23 inside the N-well that are connected to the pad 15. Additionally, in this embodiment, there is no N+ region inside the N-well. Another difference is that the ESD protection device of the present invention also contains a plurality of second P+ regions 24 inside the N-well that are gounded.

FIG. 2 also shows that a heavily doped second N-type region 26 and a heavily doped second P-type region 27 are provided in the P-type substrate 11 but outside of the N-type well 12. However, unlike the second N-type region 16 in the '317 patent, the second N-type region 26 of the present invention is not grounded. Only the second P+ region 27 is grounded in the present invention. The result of this structure is, as shown in FIG. 3, an ESD protection device which contains a plurality of pnp devices (FIG. 3 only symbolically shows two pnp's) connected with an npn device, and the npn device is not directly connected to the ground. The plurality of grounded second P+ regions together with the first P+ regions connected to the pad (anode) form an open base/N-well pnp bipolar transistors in the N-well. They serve as breakdown/snap-back initiators for the entire pseudo bipolar structure.

Similar to that disclosed in the '317 patent, the ESD protection device of the present invention also provides excellent robustness and does not require a very high voltage to trigger its protective action. However, the improvements provided in the present invention, including the plurality of the pnp devices, and the npn device which is not directly grounded, allows the ESD protection device of the present invention to be less vulnerable to be accidentally turned on due to non-ESD-related triggering noises such as latchup. Furthermore, in the present invention, the P+ 23 to P+ 24 spacing (i.e., the base width) can be adjusted to optimize the breakdown behavior.

EXAMPLE 2

Figure 4:
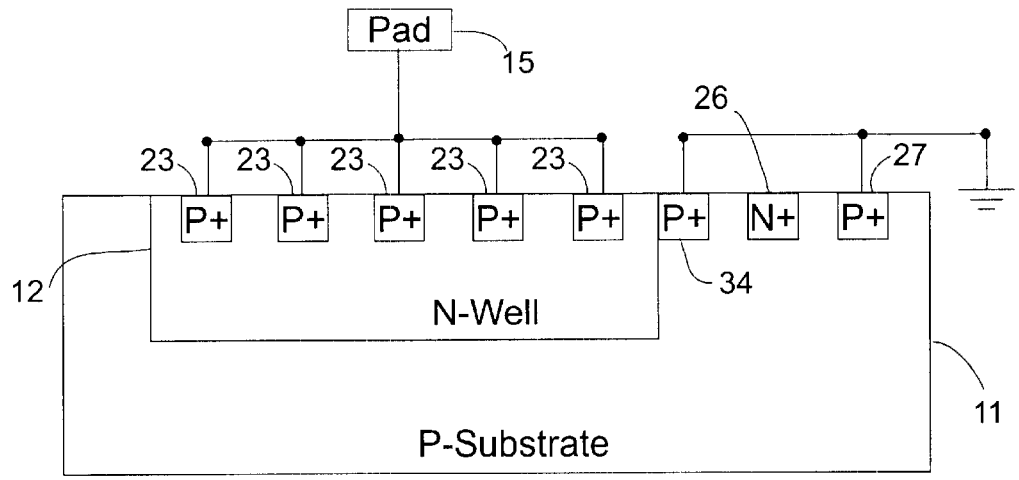
FIG. 4 is a schematic drawing showing a cross-sectional view of an improved ESD protection device according to another preferred embodiment of the present invention.

FIG. 4 is a schematic drawing showing a cross-sectional view of an improved ESD protection device according to the second preferred embodiment of the present invention. In this second preferred embodiment of the present invention, the ESD prevention device, similar to that in the first preferred embodiment, contains a P-type semiconductor substrate 11 which is lightly doped. An N-type well (or N-well) 12 is defined in the P-type substrate 11 by a diffusional process to provide a lightly doped N-type semiconductor region.

However, unlike the first preferred embodiment which contains a plurality of grounded P+ region inside the N-well, the ESD prevention device according to the second preferred embodiment of the present invention does not contain grounded P+ region in the N-well 12. Rather, the grounded P+ regions are all provided outside the N-well, with at least one of the grounded P+ regions being immediately adjacent to the N-well. Similar to the first embodiment, there is no N+ region inside the N-well.

FIG. 4 also shows that, similar to the first embodiment, a heavily doped second N-type region 26 and a heavily doped second P-type region 27 are provided in the P-type substrate 11 but outside of the N-type well 12. Also similar to the first embodiment, the second N-type region 26 is not grounded. Only the second P+ region 27 is grounded in the present invention. This arrangement allows the base width of the PNP transitor form by 23, 12, and 34, to be further adjusted to optimize the breakdown behavior.

EXAMPLE 3

Figure 5:
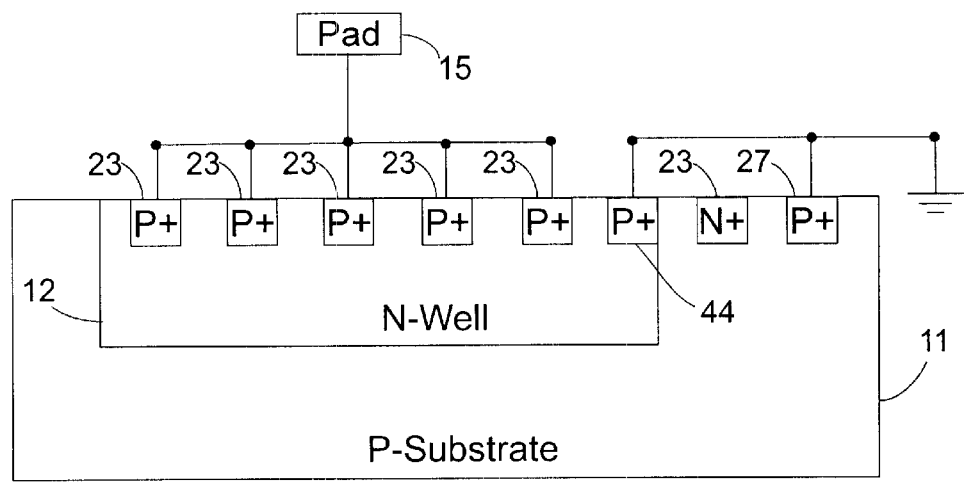
FIG. 5 is a schematic drawing showing a cross-sectional view of an improved ESD protection device according to the third preferred embodiment of the present invention.

FIG. 5 is a schematic drawing showing a cross-sectional view of an improved ESD protection device according to the third preferred embodiment of the present invention. In this third preferred embodiment of the present invention, the ESD prevention device, similar to that in the first preferred embodiment, contains a P-type semiconductor substrate 11 which is lightly doped.

An N-type well (or N-well) 12 is defined in the P-type substrate 11 by a diffusional process to provide a lightly doped N-type semiconductor region. However, unlike the first preferred embodiment which contains a plurality of grounded P+ region inside the N-well, the ESD prevention device according to the third preferred embodiment of the present invention contains only one grounded P+ region in the N-well 12. Similar to the first embodiment, there is no N+ region inside the N-well.

FIG. 5 also shows that, similar to the first embodiment, a heavily doped second N-type region 26 and a heavily doped second P-type region 27 are provided in the P-type substrate 11 but outside of the N-type well 12. Also similar to the first embodiment, the second N-type region 26 is not grounded. Only the second P+ region 27 is grounded in the present invention.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An electrostatic discharge (ESD) protection device to protect semiconductor devices against high-voltage transients due to electrostatic discharge, comprising:
   (a) an N-type well formed in a P-type substrate;
   (b) a plurality of first P+ regions formed in said P-type substrate; wherein each of said first P+ regions is connected to an input pad and all of said plurality of said first P+ regions are formed inside said N-type well;
   (c) a plurality of second P+ regions formed in said P-type substrate, wherein each of said second P+ regions is connected to said ground, at least one of said second P+ regions is outside said N-type well, and at least one of said second P+ regions is disposed either inside said N-type well or outside of but immediately adjacent to said N-type well; and
   (d) an N+ region formed outside of said N-type well, wherein said N+ region is not grounded;
   (e) whereby said plurality of first P+ regions, said plurality of second P+ regions, said N+ region, and said N-type well form a plurality of pnp devices to allow a transient voltage to be discharged from the input pad to ground.

2. The electrostatic discharge (ESD) protection device according to claim 1 wherein each said second P+ region that is formed outside of said N-well is heavily doped.

3. The electrostatic discharge (ESD) protection device according to claim 1 which contains a plurality of said second P+ regions inside said N-well.

4. The electrostatic discharge (ESD) protection device according to claim 1 which contains only one said second P+ region inside said N-well.

5. The electrostatic discharge (ESD) protection device according to claim 1 which does not contain any said second P+ region inside said N-well, but contains at least one said P+ region immediately adjacent to said N-well.

6. An integrated circuit containing an electrostatic discharge (ESD) protection device to protect semiconductor devices against high-voltage transients due to electrostatic discharge, said electrostatic discharge protection device comprising:

(a) an N-type well formed in a P-type substrate;
(b) a plurality of first P+ regions formed in said P-type substrate; wherein each of said first P+ regions is connected to an input pad and all of said plurality of said first P+ regions are formed inside said N-type well;
(c) a plurality of second P+ regions formed in said P-type substrate, wherein each of said second P+ regions is connected to said ground, at least one of said second P+ regions is outside said N-type well, and at least one of said second P+ regions is disposed either inside said N-type well or outside of but immediately adjacent to said N-type well; and
(d) an N+ region formed outside of said N-type well, wherein said N+ region is not grounded;
(e) whereby said plurality of first P+ regions, said plurality of second P+ regions, said N+ region, and said N-type well form a plurality of pnp devices to allow a transient voltage to be discharged from the input pad to ground.

7. The integrated circuit according to claim 6 wherein each said second P+ region that is formed outside of said N-well is heavily doped.

8. The integrated circuit according to claim 6 wherein said electrostatic discharge protection device contains a plurality of said second P+ regions inside said N-well.

9. The integrated circuit according to claim 6 wherein said electrostatic discharge protection device contains only one said second P+ region inside said N-well.

10. The integrated circuit according to claim 6 wherein said electrostatic discharge protection device does not contain any said second P+ region inside said N-well, but contains at least one said second P+ region immediately adjacent to said N-well.

* * * * *